United States Patent
Aspar et al.

(10) Patent No.: US 8,044,465 B2
(45) Date of Patent: Oct. 25, 2011

(54) METHOD FOR PRODUCING PARTIAL SOI STRUCTURES COMPRISING ZONES CONNECTING A SUPERFICIAL LAYER AND A SUBSTRATE

(75) Inventors: Bernard Aspar, Rives (FR); Chrystelle Lagahe-Blanchard, Saint Joseph de Riviere (FR)

(73) Assignee: S.O.I.TEC Solicon On Insulator Technologies, Bernin (FR)

( * ) Notice: Subject to any disclaimer, the term of this patent is extended or adjusted under 35 U.S.C. 154(b) by 0 days.

(21) Appl. No.: 12/730,636

(22) Filed: Mar. 24, 2010

(65) Prior Publication Data
US 2010/0176397 A1 Jul. 15, 2010

Related U.S. Application Data

(62) Division of application No. 11/673,820, filed on Feb. 12, 2007, now Pat. No. 7,709,305.

(60) Provisional application No. 60/838,162, filed on Aug. 17, 2006.

(30) Foreign Application Priority Data

Feb. 27, 2006 (FR) .................................. 06 01696

(51) Int. Cl.
*H01L 29/786* (2006.01)

(52) U.S. Cl. ... 257/354; 257/51; 257/347; 257/E27.112; 438/150; 438/166; 438/455; 428/641

(58) Field of Classification Search ............... 257/354, 257/E27.112, 347, 51; 438/150, 166, 455; 428/641
See application file for complete search history.

(56) References Cited

U.S. PATENT DOCUMENTS

| 4,653,858 A | 3/1987 | Szydlo et al. |
| 4,710,794 A | 12/1987 | Koshino et al. |
| 4,956,314 A | 9/1990 | Tam et al. |
| 5,238,865 A | 8/1993 | Eguchi |
| 5,466,630 A | 11/1995 | Lur |
| 5,733,813 A | 3/1998 | Chen et al. |
| 5,972,758 A | 10/1999 | Liang |
| 6,060,344 A | 5/2000 | Matsui et al. |
| 6,124,185 A | 9/2000 | Doyle |
| 6,171,923 B1 | 1/2001 | Chi et al. |

(Continued)

FOREIGN PATENT DOCUMENTS

EP 0 736 897 10/1996

(Continued)

OTHER PUBLICATIONS

A.J. Auberton-Herve', et. al. "Why Can Smart Cut Change the Future of Microelectronics?", International Journal of High Speed Electronics and Systems, vol. 10, No. 1, 2000, pp. 131-146.

(Continued)

*Primary Examiner* — Tu-Tu Ho
(74) *Attorney, Agent, or Firm* — Oblon, Spivak, McClelland, Maier & Neustadt, L.L.P.

(57) ABSTRACT

The invention relates to a method for producing a semiconductor structure comprising a superficial layer, at least one embedded layer, and a support, which method comprises:
- a step of forming, on a first support, patterns in a first material,
- a step of forming a semiconductor layer, between and on said patterns,
- a step of assembling said semiconductor layer with a second support.

8 Claims, 3 Drawing Sheets

U.S. PATENT DOCUMENTS

| | | | |
|---|---|---|---|
| 6,191,007 B1 * | 2/2001 | Matsui et al. | 438/459 |
| 6,235,607 B1 | 5/2001 | Ibok | |
| 6,245,636 B1 | 6/2001 | Maszara | |
| 6,372,657 B1 | 4/2002 | Hineman et al. | |
| 6,417,078 B1 | 7/2002 | Dolan | |
| 6,531,375 B1 | 3/2003 | Giewont et al. | |
| 6,727,186 B1 | 4/2004 | Skotnicki et al. | |
| 6,955,971 B2 | 10/2005 | Ghyselen et al. | |
| 7,348,253 B2 | 3/2008 | Bedell et al. | |
| 7,494,897 B2 | 2/2009 | Fournel et al. | |
| 2002/0079551 A1 | 6/2002 | Hokozono | |
| 2003/0077885 A1 | 4/2003 | Aspar et al. | |
| 2003/0096506 A1 | 5/2003 | Li et al. | |
| 2004/0048091 A1 * | 3/2004 | Sato et al. | 428/641 |
| 2004/0058511 A1 * | 3/2004 | Sakaguchi | 438/458 |
| 2004/0065931 A1 | 4/2004 | Benzel et al. | |
| 2004/0081805 A1 | 4/2004 | Furihata et al. | |
| 2004/0127061 A1 | 7/2004 | Yu | |
| 2004/0150067 A1 | 8/2004 | Ghyselen et al. | |
| 2004/0180519 A1 | 9/2004 | Schwarzenbach et al. | |
| 2004/0241934 A1 | 12/2004 | Inoue | |
| 2006/0166461 A1 | 7/2006 | Fournel et al. | |
| 2007/0048919 A1 * | 3/2007 | Adetutu et al. | 438/199 |
| 2007/0132022 A1 * | 6/2007 | Son et al. | 257/347 |
| 2007/0202660 A1 | 8/2007 | Moriceau et al. | |
| 2008/0036039 A1 | 2/2008 | Aspar | |

FOREIGN PATENT DOCUMENTS

| | | |
|---|---|---|
| EP | 1 398 829 A2 | 3/2004 |
| FR | 2 847 077 | 5/2004 |
| FR | 2 850 487 | 7/2004 |
| FR | 2 876 220 | 4/2006 |
| WO | WO 01/93325 | 12/2001 |
| WO | WO 2004/019362 | 3/2004 |
| WO | WO 2004/044975 | 5/2004 |
| WO | WO 2004/059711 | 7/2004 |
| WO | WO 2004/059725 | 7/2004 |

OTHER PUBLICATIONS

J. Steigerwald, et al., "CMP of Other Materials and New CMP Applications", Chemical Mechanical Planarization of Microelectronic Materials, Chapter 8, pp. 269-277, John Wiley & Sons, New York, 1997.

Q.Y. Tong, et al., "Semiconductor Wafer Bonding, Science and Technology", The Electrochemical Society Series, 1999, 159 Pages.

C. H. Yun, et al., "SOI on Buried Cavity Patterns Using Ion-Cut Layer Transfer," Proceedings 1998 IEEE International SOI Conference, Oct. 1998, pp. 165-166.

* cited by examiner

METHOD FOR PRODUCING PARTIAL SOI STRUCTURES COMPRISING ZONES CONNECTING A SUPERFICIAL LAYER AND A SUBSTRATE

TECHNICAL FIELD AND PRIOR ART

The invention relates to the production of new structures of semiconductor components or MEMS-type devices, and in particular SOI or SOI-type devices.

Numerous microsystems or MEMS (Micro Electro Mechanical Systems) are produced using SOI (Silicon On Insulator) materials, which make it possible in particular to obtain monocrystalline silicon membranes suspended above a cavity.

In various applications in the field of power electronics and microsystems, it can be advantageous to have a structure combining the functions of a "bulk" silicon substrate and an SOI substrate: i.e. comprising local zones 2 of embedded oxide (for example $SiO_2$) under an active layer 4, as shown in FIG. 1.

To obtain this type of structure, a number of methods have already been described, for example in document FR 0216646.

In this type of method, one problem is that of having to condition a heterogeneous surface.

The problem of producing a structure comprising SOI zones and Si zones, as shown in FIG. 1, is posed.

More specifically, the goal is to find a technique simpler than those already known, in particular overcoming the problem associated with the presence of heterogeneous surfaces, which require specific methods to be used.

DESCRIPTION OF THE INVENTION

The invention first relates to a method for producing a semiconductor structure, comprising a superficial layer, at least one buried or embedded layer, and a support, which method comprises:
- a step of forming, on a first support or substrate, patterns in a first material,
- a step of forming a layer made of a second, semiconductor material between and on said patterns,
- a step of heat-treating the semiconductor layer so as to totally or partially modify the crystallinity thereof,
- a step of assembling said semiconductor layer with a second support or substrate.

The semiconductor layer can be made of monocrystalline and/or polycrystalline and/or amorphous silicon.

It can also comprise zones of a first type of crystallinity and zones of a second type of crystallinity, different from the first. For example it comprises zones of amorphous material and zones of polycrystalline material. According to another example it comprises crystalline zones and zones of amorphous or polycrystalline material.

The invention also relates to a method for producing a semiconductor structure, comprising a superficial layer, at least one buried or embedded layer, and a support or substrate, which method comprises:
- a step of forming, on a first support or substrate, patterns in a first material,
- a step of forming a second layer, made of amorphous silicon or monocrystalline silicon, between and on said patterns,
- a step of assembling this second layer with a second support or substrate.

A step of heat-treating the semiconductor layer can be performed so as to totally or partially modify the crystallinity thereof.

The semiconductor layer can comprise zones of a first type of crystallinity and zones of a second type of crystallinity, different from the first. For example it comprises zones of amorphous material and zones of polycrystalline material. According to another example it comprises crystalline zones and zones of amorphous or polycrystalline material.

The invention also relates to another method for producing a semiconductor structure comprising a superficial layer, at least one buried or embedded layer, and a support or substrate, which method comprises:
- a step of forming, on a first support or substrate, patterns in a first material,
- a step of forming a semiconductor layer, between and on said patterns, which semiconductor layer comprises zones of a first type of crystallinity and zones of a second type of crystallinity, different from the first,
- a step of assembling this second layer with a second support or substrate.

The semiconductor layer can be, for example, made of monocrystalline and/or polycrystalline and/or amorphous silicon.

The patterns can be formed, for example, from a layer, which can be an insulating layer, for example an oxide or nitride layer. It is, for example, produced by thermal oxidation, or by oxide deposition using the LPCVD technique, or by oxide deposition using the PECVD technique. The patterns can be formed by any other conventional means used in microelectronics.

In general, this layer, from which the patterns can be formed, can be a layer consisting of different materials and/or multilayers.

In general, the semiconductor layer can also be formed by epitaxy or deposition; in the case of epitaxy, it can be formed at a speed dependent on the surface on which the epitaxy is performed, which enables a relatively planar surface to be obtained after growth.

A step of planarisation of the semiconductor layer can be performed, before assembly with the second substrate.

A step of hydrophilic or hydrophobic preparation of the surface of the semiconductor layer can be performed before assembly of this layer with the second support or substrate.

An annealing step can be performed after assembly of the semiconductor layer with the second support or substrate.

A step of thinning, and optionally a routing stage or a step of edge grinding of the substrate to be thinned, before or after thinning, can also be performed.

The invention also relates to a semiconductor device comprising a superficial layer, at least one embedded layer, and a support or substrate, the embedded layer comprising a first sublayer of amorphous or monocrystalline silicon, and a second sublayer comprising an alternation of patterns of a first material and zones of amorphous or monocrystalline silicon.

The invention also relates to a semiconductor device comprising a superficial layer, at least one buried or embedded layer, and a support or substrate, the buried or embedded layer comprising a first sublayer comprising an alternation of patterns of a first material and zones of a second, semiconductor material, and a second sublayer made of a semiconductor material comprising zones of a first type of crystallinity and zones of a second type of crystallinity.

The second sublayer can be made of monocrystalline and/or polycrystalline and/or amorphous silicon.

By one of the methods according to the invention, it is possible to obtain a structure comprising an active superficial layer of variable thickness, of which certain zones are insulated from the substrate, for example by an embedded or a buried oxide layer, and of which other zones act as a semiconductor (for example: Si) bulk (or massive); there is then vertical thermal and/or electrical conduction with the substrate.

With respect to the techniques already known, the invention avoids the planarisation of the heterogeneous surface (for example having an alternation of $SiO_2$/Si). The surface to be planarised is homogeneous (it is, for example, a deposit of Si or silicon obtained by epitaxial growth), in which case the implementation of specific and complex planarisation methods can be avoided so as to solve the problems of differential attack speeds ("dishing").

The invention can be applied to other semiconductors, such as Ga, SiC, AsGa, InP or SiGe.

DETAILED DESCRIPTION OF SPECIFIC EMBODIMENTS

Figure 1:
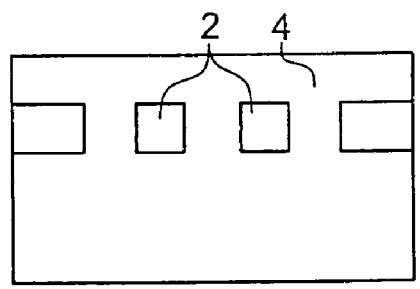
FIG. 1 shows a mixed BSOI-type structure.
Figure 2A:
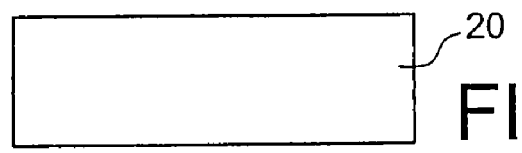
FIGS. 2A to 2G show various steps of a production method according to the invention.

A method according to the invention, for developing a structure such as that shown in FIG. 1, will be described in reference to FIGS. 2A to 2G, starting with a semiconductor material, for example Si (FIG. 2A).

Figure 2B:
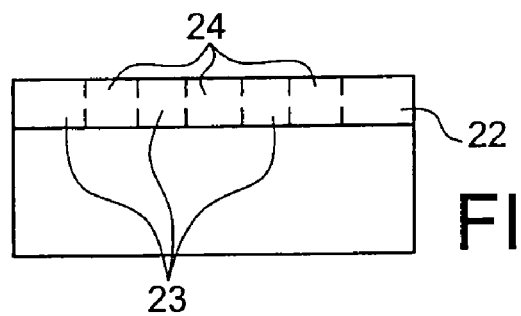

A layer 22 is first produced, which is intended to be a buried layer or an embedded layer or an embedded or a buried layer structured by patterns, for example a dielectric layer, in particular of oxide, such as a silicon oxide, of which the thickness will correspond to the desired thickness of the patterns 23 buried or embedded in the final structure (FIG. 2B). This layer 22 can be made in different ways: by thermal oxidation, or LPCVD oxide deposition, or PECVD oxide deposition, and so on. This embedded layer 22 can also be made up of different materials (for example: a nitride such as $Si_xN_y$ and/or an oxide such as $Al_2O_3$ and/or a doped silicon oxide (PSG- or BPSG-type, etc.)), and/or multilayers (again, with a nitride such as $Si_xN_y$ and/or an oxide such as $Al_2O_3$ and/or a doped silicon oxide such as PSG or BPSG), according to the functionalities desired for the application.

Figure 2C:
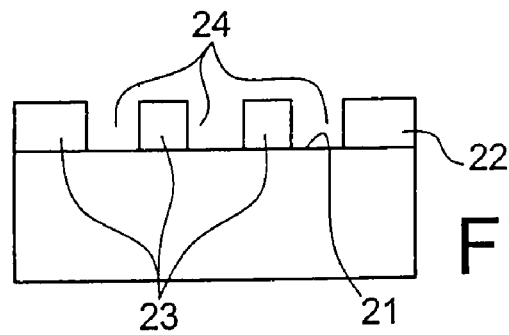

Then, the distribution of patterns 23 is defined in this layer 22. The zones 24 between these patterns are, for example, etched to the level of the underlying substrate 20, for example, by lithography and etching of the layer 22 (FIG. 2C). Thus, at the surface of the substrate, an alternation of patterns 23 and zones 24 between the patterns is obtained. The distribution of patterns 23 can be obtained by any other technique, not only by etching. This distribution is arranged according to the needs of the application. In addition, the patterns can have different shapes (from the top view: circular shape, and/or square, and/or other, etc.) and variable sizes (submicronic to millimetric). The zones 24 between the patterns 23 can reach the surface 21 of the substrate 20, which makes it possible to alternate, on this surface 21, patterns of material 23 (oxide in the example given) and, between these patterns, zones 24 without material and directly reaching the substrate 20. The patterns are thus formed directly on semiconductor substrate 20.

The patterns can be obtained by other combinations of microelectronic methods such as oxidation, oxide deposition, etching, photolithography, and so on.

Figure 2D:
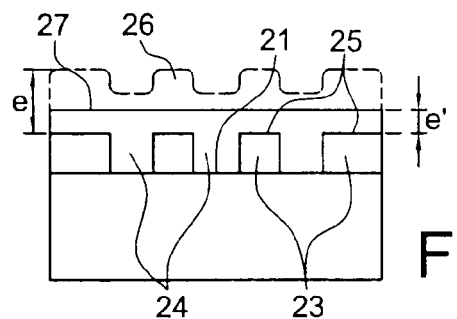

A deposition or epitaxial production of semiconductor material 26 is performed on the substrate thus prepared (FIG. 2D). In general, the layer of thickness e above the patterns 23 substantially matches the shape and distribution of the patterns 23.

A layer of semiconductor material 26 is therefore made directly on and between the patterns. Between said patterns, the semiconductor layer is in contact with semiconductor substrate 20.

Figure 3:
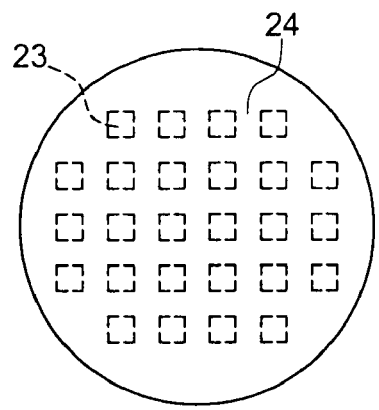
FIG. 3 shows a structure according to the invention from a top view.

FIG. 3 shows an example, from a top view, of a substrate on which etched zones 24, filled with material 26, are produced between patterns 23.

Configurations other than that of FIG. 3 can be produced.

The semiconductor material 26 is, for example, silicon (amorphous, polycrystalline or crystalline), with the type of silicon being selected according to the needs of the application and/or according to the possibilities of each technique, in particular according to the thicknesses that must be deposited. Other semiconductor materials can be chosen, for example SiC, or GaN or materials of type III to V. For these materials, there is also the possibility of having various types of crystallinity (for example, polycrystalline or monocrystalline SiC).

Figure 2E:
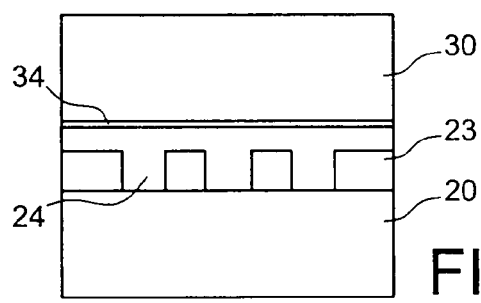
Figure 2F:
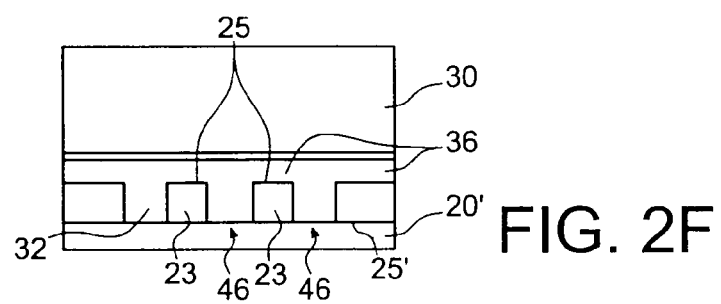
Figure 2G:
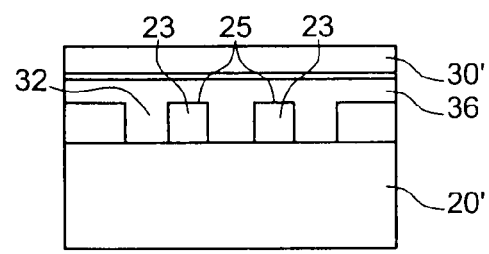

It can be advantageous to choose the semiconductor 26 of the same type (material, doping, etc.) as the material of the future superficial layer 20', 30' (see FIGS. 2F and 2G). However, in some cases, it can be advantageous for the type of semiconductor layer 26 to be different from that of the superficial layer 20', 30'.

This material 26 is alternatively in contact with the surface 21 of the substrate 20 and with the insulating patterns 23.

The thickness e of the deposited material is chosen so as to then allow for a reduction in the topology by planarisation, so as to obtain a thickness e' (FIG. 2D) with 0<e'<e, without leading to the apex 25 of the oxide patterns 23 or without leaving said apex with no deposited material on it.

According to the type of technique used to produce this semiconductor material layer 26, various crystallinities can be obtained: for example, in the case of Si, it is possible to produce an epitaxial layer of monocrystalline Si, or a deposit of polycrystalline or amorphous Si using different techniques (LPCVD, PECVD, etc.).

The production of an amorphous Si deposit on alternating zones of Si (surface 21 of the substrate 20) and $SiO_2$ (patterns 23) can result in a layer alternating between polycrystalline material (on the surface 21) and amorphous material (on the patterns 23), while the epitaxial production of Si on alternating zones of Si (surface 21) and $SiO_2$ (patterns 23) generally results in a layer alternating between crystalline material (on the surface 21) and amorphous or polycrystalline material (on the patterns 23).

Figure 4:
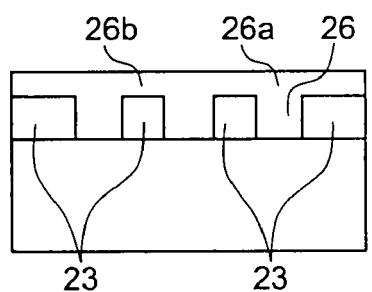
FIG. 4 shows an alternative of a device according to the invention.

It can thus be advantageous, for certain applications, to alternate between different crystallinities of the layer 26 according to the requirements in terms of electrical and/or thermal conduction and/or in terms of gettering and/or mechanical features. Therefore, it is possible to form, as shown in FIG. 4, on a single sublayer comprising an alternation between patterns 23 and semiconductor material 26, an alternation of zones of semiconductor material 26a having a first type of crystallinity, and semiconductor material 26b having a second type of crystallinity, different from the first. Examples of various combinations are shown below.

Moreover, it is possible to choose the physical properties, for example electrical (conductor, insulating, etc), and/or thermal (conductibility) and/or mechanical, of this deposited layer 26 according to the needs of the application. For this, it is possible to vary the composition (with greater or less doping) and/or the conditions under which this layer 26 is formed.

A heat treatment of the deposited layer 26 can be performed so as to modify the crystallinity of the layer. For example, a layer 26 of amorphous and/or polycrystalline Si can be deposited, then annealed at 1100° C.

This heat treatment of layer 26 is performed before assembly and adhesion with substrate 30 (see FIG. 2E) and can therefore physically modify said layer 26 (by modifying its crystallinity).

The layer 26 can then be conditioned so as to obtain a smooth surface 27 (FIG. 2D) enabling a surface state compatible with the subsequent bonding phase to be obtained.

This conditioning of the layer 26 can be performed by planarisation, for example by chemical-mechanical polishing, mechanical thinning or chemical thinning (dry plasma attack or RIE: reactive ion etching capable of reducing the surface topology) or by a combination of these different techniques.

Figure 5:
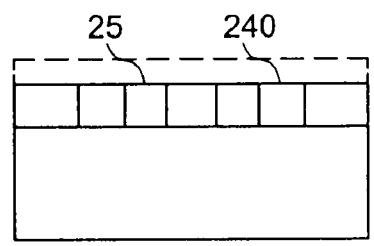
FIG. 5 shows the case of epitaxial growth on different surfaces.

This planarisation can be substantially reduced and/or avoided if, for example, the speed of epitaxy of the layer 26 is controlled according to the surfaces on which the growth is being carried out: for example (FIG. 5), the speed of growth on the surfaces 240 of semiconductor material can be greater than the speed of growth at the level of the oxide zones 25; the control of these relative speeds can make it possible to obtain a relatively planar surface after growth of this layer.

The substrate 20 thus prepared is then bound by molecular adhesion to a substrate 30, for example made of silicon (FIG. 2E). The various types of surface preparation and binding that can be performed are indicated below.

A hydrophilic- or hydrophobic-type surface preparation can be performed before this assembly of the substrates. If the patterns 23 are electrically insulating (for example, made of oxide), the desired final structure comprises zones 36 isolated from the substrate 20' (SOI) and conductive zones 46 between these zones 36 (FIG. 2F).

In the case of hydrophilic bonding, a native oxide layer 34 is present at the bonding interface, and can compromise the ohmic contact between the substrates 20 and 30. In this case, if an ohmic contact is desired for a particular application, it is possible to treat the structure at high temperature (>1100° C.) so as to cause the dissolution of this oxide at the level of the bonding interface and thus produce an ohmic contact at the level of the conductive zones 46.

For some applications, the heat treatment can be performed at a lower temperature.

In the case of hydrophobic bonding, the surfaces placed in contact are free of native oxide 34 and an ohmic contact is obtained directly.

Preferably, after bonding, the structure is annealed at high temperature, on the one hand so as to allow for consolidation of the bonding interface (reinforcement of the bonding strength) and, on the other hand, as shown above in the case of hydrophilic bonding, so as to generate the dissolution of the interface oxide and an ohmic contact.

The heat treatment is performed at a temperature compatible with the structure and/or with the subsequent steps to be performed to produce the final structure.

Preferably, a heat treatment step will be performed after deposition of the layer 26, at a temperature preferably higher than or equal to the subsequent temperature for consolidation of the bonding interface. In some cases, it may be lower than the consolidation temperature.

For example, in the case of silicon, the heat treatment can take place at a temperature within the range of 700 to 1300° C.

The substrate 20 and/or the substrate 30 can be thinned by its rear surface so as to obtain the future active semiconductor layer 20' (FIG. 2F) in which the components will be developed. In FIG. 2F, it is substrate 20 that is thinned. When substrate 30 is thinned, a structure like that of FIG. 2G is obtained, in which the apex 25 of the pads 23 is turned toward substrate 30' (substrate 30 after thinning), but separated from 30' by the layer 36. In FIG. 2F, it is the other apex 25' of the pads 23 that is turned toward the substrate or the thinned layer 20', which apex is even in contact with layer 20' in the example shown.

This thinning can be performed by mechanical grinding and/or chemical-mechanical polishing and/or mechanical polishing and/or chemical etching (wet or dry) techniques.

Preferably, it is substrate 20 that will be thinned (FIG. 2F). The thinning can also be performed by using a "Smart-Cut®"-type technique, or by substrate fracture. The "Smart-Cut®"-type technique is disclosed for example in the article by A. J. Auberton-Hervé et al. <<Why can Smart-Cut change the future of microelectronics?>> International Journal of High Speed Electronics and Systems, Vol. 10, N°0.1 (2000), p. 131-146.

Examples of embodiments according to the invention will now be provided.

EXAMPLE 1

In this example, the following steps are performed:
$a_1$) thermal oxidation of a silicon substrate 20, for example by generating 2 μm of oxide;
$b_1$) lithography of the patterns 24 to define future SOI and Si zones;
$c_1$) etching of the oxide 22 at the level of the future Si zones defined and removal of the etching mask;
$d_1$) cleaning of the surface and deposition of a polycrystalline silicon (p-Si) layer 26 by LPCVD (at around 650° C.), for example, deposition of a layer having a thickness of around 4 μm;
$e_1$) heat treatment at 1100° C.;
$f_1$) planarisation of the p-Si surface 26 so as to remove the topology between the SOI and Si zones by chemical-mechanical polishing; however, one remains on a homogenous poly-Si surface, and never move onto a heterogeneous SiO$_2$/Si surface;
$g_1$) hydrophilic-type cleaning and placement in contact for direct bonding by molecular adhesion of the substrate 20—pattern 23—layer 26 assembly and a silicon-free substrate 30;
$h_1$) heat treatment for consolidation of the bonding interface at 1100° C.;
$i_1$) thinning of the rear surface of the substrate 20 by mechanical grinding, then by chemical-mechanical polishing, for example until a thickness of 10 μm is obtained (this final thickness may vary according to the needs of the application between 2 μm and several hundred microns, for example 500 μm). A structure as shown in FIG. 2F is thus obtained.

EXAMPLE 2

In this example, the following steps are performed:
steps $a_2$ to $c_2$: same as steps $a_1$ to $c_1$.

$d_2$) cleaning of the surface and deposition of an amorphous silicon (a-Si) layer 26 by PECVD, for example, deposition of a layer having a thickness of around 5 μm;

$e_2$) heat treatment at 1100° C.;

$f_2$) planarisation of the a-Si surface 26 so as to remove the topology between the SOI and Si zones by chemical-mechanical polishing;

$g_2$) hydrophobic-type cleaning and placement in contact for direct bonding by molecular adhesion of the substrate 20 and a silicon-free substrate 30;

$h_2$) same as $h_1$;

$i_2$) thinning of the rear surface of the substrate 30 by mechanical grinding, then by chemical-mechanical polishing, for example until a thickness of 20 μm is obtained. A structure as shown in FIG. 2G is thus obtained.

EXAMPLE 3

In this example, the following steps are performed:

$a_3$) thermal oxidation of a silicon substrate 20, for example by generating 3 μm of oxide;

$b_3$) to $c_3$): same as $b_1$) to $c_1$);

$d_3$) cleaning of the surface and deposition of a polycrystalline silicon (p-Si) layer 26 by LPCVD (at around 650° C.), for example, deposition of a layer having a thickness of around 7 μm;

$e_3$) same as $e_1$);

$f_3$) planarisation of the p-Si surface 26 so as to remove the topology between the SOI and Si zones by dry polishing, then surface finishing by chemical-mechanical polishing;

$g_3$) to $h_3$): same as $g_1$) to $h_1$);

$i_3$) thinning of the rear surface of the substrate 20 by mechanical grinding, then by chemical-mechanical polishing, for example until a thickness of 20 μm is obtained. A structure as shown in FIG. 2F is thus obtained.

EXAMPLE 4

In this example, the following steps are performed:

$a_4$) to $e_4$): same as $a_3$) to $e_3$);

$f_4$) planarisation of the p-Si surface 26 so as to remove the topology between the SOI and Si zones by mechanical grinding with a fine wheel (for example #8000), then chemical-mechanical polishing for surface finishing;

$g_4$) to $i_4$): same as $g_3$) to $i_3$).

EXAMPLE 5

In this example, the following steps are performed:

$a_5$) to $c_5$): same as $a_3$) to $c_3$);

$d_5$) cleaning of the surface and epitaxy of a silicon layer 26 (at around 750° C.), for example, growth of a layer having a thickness of around 10 μm;

$e_5$) heat treatment at 1100° C.;

$f_5$) planarisation of the Si surface so as to remove the topology between the SOI and Si zones by chemical-mechanical polishing;

$g_5$) same as $g_2$);

$h_5$) heat treatment for consolidation of the bonding interface at 1150° C.;

$i_5$) thinning of the rear surface of the substrate 30 by mechanical grinding, then by chemical-mechanical polishing, for example until a thickness of 10 μm is obtained.

EXAMPLE 6

In this example, the following steps are performed:

$a_6$) to $c_6$): same as $a_2$) to $c_2$);

$d_6$) cleaning of the surface and epitaxy of a silicon layer 26 (at around 850° C.), for example, by growth of a layer having a thickness of around 10 μm;

$e_6$) to $f_6$): same as $e_5$) to $f_s$);

$g_6$) hydrophobic-type cleaning and placement in contact for direct bonding by molecular adhesion of the substrate 20 and a silicon-free substrate 30;

$h_6$) heat treatment for consolidation of the bonding interface at 850° C.;

$i_6$) same as $h_5$).

The fields of application concerned by the invention are power electronics applications and the production of MEMS.

It is also possible to produce an insulating structure with contact pads providing vertical electrical conduction.

It is also possible to produce mixed components (on Si and on SOI), as well as components requiring heat evacuation (vertical heat conductibility). In the second case, the conduction can be essentially thermal and not electrical. Typically, it is possible to deposit a semiconductor layer, for example of amorphous silicon, with electrically insulating characteristics, while having good vertical heat conductivity (corresponding to components requiring greater heat evacuation, for example).

Materials other than those indicated above can be used for one of the substrates, or the bonding layer (epitaxy, deposition, etc.), so as to satisfy various needs in terms of electrical and/or heat conduction, and/or other needs: SiC (good heat conductivity properties), or GaN, or materials III to V, and so on.

The invention claimed is:

1. Semiconductor device comprising a superficial layer, at least one buried layer, and a substrate, said buried layer comprising a first sublayer comprising an alternation of patterns made of a first material and zones made of a second, semiconductor material, and a second sublayer comprising zones of a third, semiconductor material of a first type of crystallinity and zones of the third, semiconductor material of a second type of crystallinity.

2. Device according to claim 1, wherein said third, semiconductor material is silicon.

3. Device according to claim 1, wherein said second, semiconductor material is silicon.

4. Device according to claim 1, wherein said first material is a dielectric material.

5. Device according to claim 4, wherein said dielectric material is an oxide or a nitride.

6. Device according to claim 5, wherein said dielectric material is an oxide, produced by thermal oxidation, produced by oxide deposition using the LPCVD technique, or produced by oxide deposition using the PECVD technique.

7. Device according to claim 1, wherein the first sublayer is directly on the substrate.

8. Device according to claim 1, wherein the second sublayer is directly on the substrate.

* * * * *

UNITED STATES PATENT AND TRADEMARK OFFICE
CERTIFICATE OF CORRECTION

Page 1 of 1

PATENT NO. : 8,044,465 B2
APPLICATION NO. : 12/730636
DATED : October 25, 2011
INVENTOR(S) : Bernard Aspar et al.

It is certified that error appears in the above-identified patent and that said Letters Patent is hereby corrected as shown below:

On the title page, Item 73 should read:

-- (73) Assignee: S.O.I.TEC Silicon On Insulator Technologies, Bernin (FR) --

Signed and Sealed this
Twentieth Day of December, 2011

David J. Kappos
*Director of the United States Patent and Trademark Office*